US009165858B2

(12) United States Patent
Steger et al.

(10) Patent No.: US 9,165,858 B2
(45) Date of Patent: Oct. 20, 2015

(54) LIQUID-COOLED ARRANGEMENT HAVING MODULAR POWER SEMICONDUCTOR MODULES AND AT LEAST ONE CAPACITOR DEVICE, AND POWER SEMICONDUCTOR MODULE THEREFOR

(71) Applicants: Jürgen Steger, Hiltpolstein (DE); Markus Knebel, Tuchenbach (DE); Andreas Maul, Nürnberg (DE); Susanne Kalla, Ebermannsdorf (DE)

(72) Inventors: Jürgen Steger, Hiltpolstein (DE); Markus Knebel, Tuchenbach (DE); Andreas Maul, Nürnberg (DE); Susanne Kalla, Ebermannsdorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 295 days.

(21) Appl. No.: 13/865,184

(22) Filed: Apr. 17, 2013

(65) Prior Publication Data

US 2013/0271917 A1    Oct. 17, 2013

(30) Foreign Application Priority Data

Apr. 17, 2012 (DE) .......................... 10 2012 206 271

(51) Int. Cl.
  *G06F 1/20* (2006.01)
  *H05K 5/00* (2006.01)
  (Continued)

(52) U.S. Cl.
  CPC ............... *H01L 23/473* (2013.01); *H01H 9/52* (2013.01); *H01L 23/06* (2013.01); *H01L 25/074* (2013.01);
  (Continued)

(58) Field of Classification Search
  CPC ...... H05K 7/20; H05K 7/20927; H01L 23/06; H01L 23/34; H01L 23/36; H01L 23/473; H01H 9/52

USPC ............ 257/714, 723, 724, 729; 361/679.53, 361/676–678, 679.46–679.54, 688–723, 361/752, 760, 762, 831; 174/578, 526, 252, 174/520; 62/3.2, 3.7; 136/204
See application file for complete search history.

(56) References Cited

U.S. PATENT DOCUMENTS

| 5,053,856 | A | 10/1991 | Davidson |
| 7,190,070 | B2 | 3/2007 | Manz |

(Continued)

FOREIGN PATENT DOCUMENTS

| DE | 10 2005 052 756 | 7/2006 |
| DE | 60 2005 006 310 | 5/2009 |

(Continued)

OTHER PUBLICATIONS

German Patent Office Search Report in corresponding application, Dec. 4, 2012.

*Primary Examiner* — Courtney Smith
*Assistant Examiner* — Zhengfu Feng
(74) *Attorney, Agent, or Firm* — The Law Offices of Roger S. Thomson (57) ABSTRACT

An arrangement having a cooling circulation, a plurality of modular power semiconductor modules and at least one capacitor, wherein a power semiconductor module has a power electronics switch and a cooling device, which is capable of carrying a flow of a cooling fluid, for cooling the switch, the cooling device having at least one cooling face, and four connection devices for the cooling fluid. The connection devices are arranged in pairs on main sides of the power semiconductor module. The power semiconductor modules have their main sides strung together modularly by connecting corresponding connection devices on successive power semiconductor modules. To this end, at least two successive power semiconductor modules have a capacitor arranged between them which, for its part, is cooled by means of the cooling circulation of the cooling fluid as provided by the arrangement.

17 Claims, 4 Drawing Sheets

(51) Int. Cl.
*H05K 7/20* (2006.01)
*H01L 23/34* (2006.01)
*F25B 21/02* (2006.01)
*H05K 1/00* (2006.01)
*H01R 13/46* (2006.01)
*H01L 23/473* (2006.01)
*H01H 9/52* (2006.01)
*H01L 23/06* (2006.01)
*H01L 25/07* (2006.01)
*H01L 25/11* (2006.01)
*H01L 23/36* (2006.01)

(52) U.S. Cl.
CPC ................ *H01L 25/117* (2013.01); *H05K 7/20* (2013.01); *H05K 7/20927* (2013.01); *H01L 23/34* (2013.01); *H01L 23/36* (2013.01); *H01L 2924/0002* (2013.01)

(56) References Cited

U.S. PATENT DOCUMENTS

| | | | |
|---|---|---|---|
| 7,835,151 | B2 | 11/2010 | Olesen |
| 7,952,875 | B2 | 5/2011 | Woody et al. |
| 8,125,781 | B2 | 2/2012 | Mamitsu et al. |
| 8,628,896 | B2 | 1/2014 | Ikeda et al. |
| 2006/0284308 | A1* | 12/2006 | Harada et al. .................. 257/729 |
| 2009/0146293 | A1* | 6/2009 | Olesen .......................... 257/714 |

FOREIGN PATENT DOCUMENTS

| | | |
|---|---|---|
| DE | 10 2010 027 955 | 12/2010 |
| JP | 2012 015 288 | 1/2014 |

* cited by examiner

LIQUID-COOLED ARRANGEMENT HAVING MODULAR POWER SEMICONDUCTOR MODULES AND AT LEAST ONE CAPACITOR DEVICE, AND POWER SEMICONDUCTOR MODULE THEREFOR

BACKGROUND OF THE INVENTION

1. Field of the Invention

The invention relates to an arrangement having modular power semiconductor modules and at least one capacitor, particularly suitable for use in local power supply devices. For this purpose, the arrangement is provided with a liquid cooling device and can be used as an inverter circuit in wind power installations, for example.

2. Description of the Related Art

Modular power semiconductor modules and arrangements comprising them latter are known, by way of example from U.S. Pat. No. 7,190,070. The power semiconductor modules, which are called submodules therein, have a housing and load and auxiliary connections. The power semiconductor modules can be arranged next to one another on a cooling device and are connected by means of a connecting device to form an overall arrangement.

In addition, U.S. Pat. No. 7,835,151 discloses continuous-flow distribution modules and an arrangement comprising the latter. In this case, the continuous-flow distributor module has a housing, an inlet distributor, an outlet distributor and a multiplicity of continuous-flow cells as part of a cooling system. These cells may be in the form of open cells, configured to receive a power electronics switch. This produces a face that needs to be sealed between the continuous-flow distributor module and the power electronics switch.

SUMMARY OF THE INVENTION

The object of the invention is to provide improved arrangements that, in combination with liquid cooling, are compact and accessible for flexible external connection. It is likewise an object of the invention to present a particularly advantageous power semiconductor module using such an arrangement.

The inventive arrangement has a cooling circulation, a plurality of modular power semiconductor modules and at least one capacitor. In this case, a power semiconductor module has a basically parallelepipedal shape which defines two main sides, two longitudinal sides and two narrow sides which are opposite one another in respective pairs. In addition, the main sides are defined in that, in relation to the parallelepipedal basic shape, the surface area of the main sides is the largest, while correspondingly the surface area of the narrow sides is the smallest. While retaining the parallelepipedal basic shape, these respective sides are not necessarily completely planar; instead, the faces of the respective sides may have indentations and alternatively or additionally recesses, for example for connection elements.

In addition, each power semiconductor module has a power electronics switch and a cooling device, which is capable of carrying a flow of a cooling fluid, preferably a cooling liquid, therefor. In this arrangement, the cooling device has four connections for carrying the cooling fluid, and a cooling volume having at least one cooling face. In this case, a cooling volume is intended to mean either a single chamber capable of carrying a flow of the cooling fluid, or a plurality of chambers capable of carrying the flow of the cooling fluid, either in parallel or in series. These chamber(s) form cavities in the cooling device, with at least one cooling face adjoining at least one of these cavities. The at least one cooling face is preferably arranged parallel to the main sides.

The four connections of the cooling device for carrying the cooling fluid are arranged in pairs on the main sides of the power semiconductor module. The connections for the cooling fluid are designed as a flow inflow and a flow outflow and as a return inflow and a return outflow, respectively. In this context, flow is understood to mean that stream which transports the cooling fluid to an article to be cooled, while the return is particularly that stream of fluid which transports the cooling fluid away following the heat transfer from the article to be cooled.

The power semiconductor module preferably has a power electronics switch having a power electronics circuit, control connections, load input connections and load output connections. In addition, it is preferred if the power semiconductor module has a housing having recesses for these connections, and in this case the housing covers the power electronics circuit towards the cooling device.

The power semiconductor modules forming the arrangement have their main sides strung together modularly by virtue of corresponding connections on adjacent power semiconductor modules being connected to one another, either directly or indirectly. In addition, at least two successive power semiconductor modules have a capacitor arranged between them which, for its part, is cooled (either directly or indirectly) by the cooling circulation of the arrangement.

Direct cooling is intended to be understood to mean that the capacitor has a dedicated link to the cooling circulation, while indirect cooling does not have such a link.

In the case of indirect cooling, it is preferred, in principle, if the capacitor is in thermally conductive contact with a cooling face of one or both adjacent power semiconductor modules, and the corresponding connections for the cooling fluid on adjacent power semiconductor modules are directly connected to one another.

In the case of direct cooling, it is preferred if the capacitor is in thermally conductive contact with a cooling face of an adjacent power semiconductor module, and the corresponding connections for cooling fluid on adjacent power semiconductor modules are indirectly connected to one another.

In this context, a direct connection is intended to be understood to mean a connection in which the corresponding connections are connected directly with the exclusive addition of a necessary seal. An indirect connection in this case is intended to be understood to mean a connection in which the corresponding connections are not directly connected to one another. By way of example, this is the case when the capacitor is separate and has dedicated second connections which are respectively in the form of a flow inflow and a flow outflow and in the form of a return inflow and a return outflow. As a result, the corresponding connections on adjacent power semiconductor modules may be connected to one another indirectly by virtue of the capacitor being connected in between in relation to the cooling circulation.

In this case, it is particularly advantageous if the capacitor is designed to be capable of carrying a sufficient flow of the cooling fluid and, to this end, preferably has a second cooling volume and, for the flow through the latter, second branches associated with the flow and return.

Preferably, this capacitor has load connections, these being connected by compliant circuitry to associated load input connections or load output connections on at least one power semiconductor module. If the inventive arrangement is used to produce an inverter circuit then, in relation to the circuit as is standard in the art, the load input connections of the power semiconductor module are connected to the load connections of the capacitor, which thus forms a smoothing capacitor and also, at the same time or alternatively, an intermediate circuit capacitor. If the inventive arrangement is used to produce a rectifier circuit then, in relation to the circuit as is standard in the art, the load output connections of the power semiconductor module are connected to the load connections of the capacitor.

The inventive integrated power semiconductor module is particularly advantageous for such arrangements, since it has the capacitor in a common housing with the power semiconductor submodule, which essentially corresponds to the power semiconductor modules cited above. This integrated power semiconductor module likewise has a power electronics switch and a cooling device, which is capable of carrying a flow, therefor, said cooling device having a cooling volume having at least one cooling face, for cooling the power electronics circuit and the capacitor. Similarly, the integrated power semiconductor module has four connections for the cooling fluid which are arranged in pairs on main sides of the integrated power semiconductor module. The inventive integrated power semiconductor modules can have their main sides strung together directly and modularly by forming corresponding connections on successive power semiconductor modules so that they may be connected to one another directly, using necessary seals.

In one particularly advantageous embodiment, the integrated power semiconductor module is encapsulated together with its capacitor so as to be impervious to dust and moisture.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
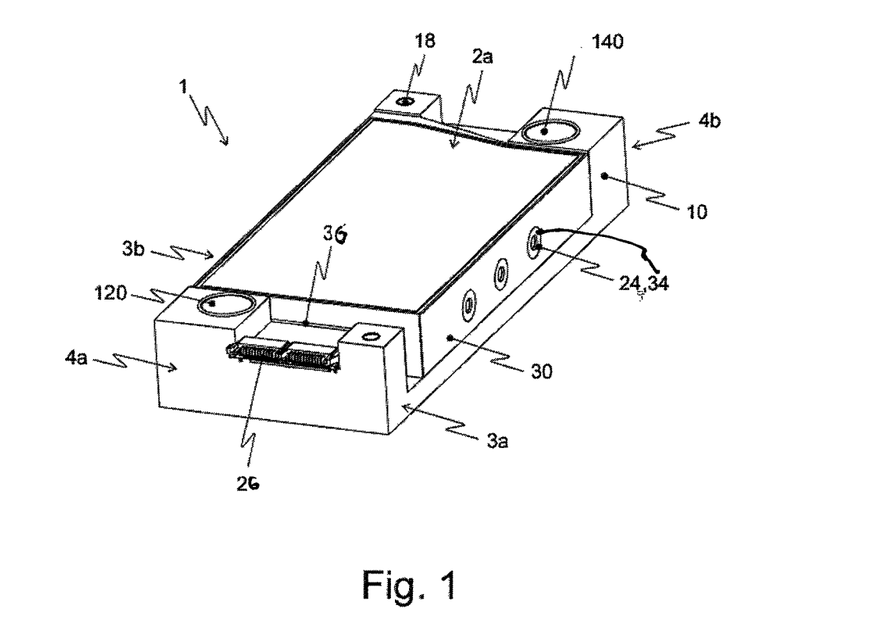
FIG. 1 shows a perspective view of a power semiconductor module which includes the inventive arrangement.
Figure 2:
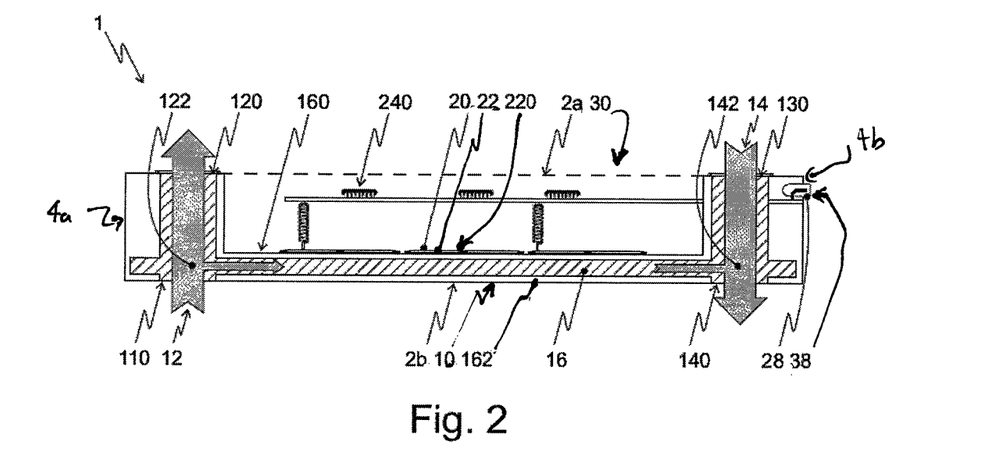
FIG. 2 shows a schematic cross-section through a power semiconductor module which includes the inventive arrangement taken parallel to a longitudinal side thereof.

FIG. 1 shows a perspective view of a power semiconductor module 1 of an arrangement 100 according to the invention (FIG. 6) in which the parallelepipedal basic shape of the power semiconductor module 1 is clearly recognizable. Power semiconductor module 1 therefore has two main sides 2a/b (only main side 2a is visible in FIG. 1) on which, in each case closely adjacent to longitudinal sides 3a/b and narrow sides 4a/b, connections 110, 120, 130, 140 for the cooling fluid are arranged in opposite corners (connections 110, 130 are seen in FIG. 2). Connections 110, 120, 130, 140 are part of a U-shaped cooling device 10 of power semiconductor module 1. A flow outflow 120 and a return outflow 140 are shown in first main face 2a, at diagonally opposed corners thereof. The two remaining corners have recesses 18 which penetrate cooling device 10 between main faces 2a/b and which may be used to connect a plurality of power semiconductor modules 1 when the latter are strung together.

FIG. 1 likewise shows a housing 30 for power semiconductor module 1. Housing 30 covers recesses in cooling device 10 and in so doing forms essential portions of first main side 2a. Housing 30 covers a power electronics circuit 22 of power electronics switch 20 of power semiconductor module 1 (FIG. 2). A load connection 24, in this case load output connection, and control connections 26 are visible from power electronics switch 20, on a narrow side thereof. These connections penetrate housing 30 at respectively associated recesses 34, 36. A second load connection corresponding to load connection 24 located in a recess corresponding to recess 34 is on the opposite longitudinal side 3b, but is not visible in the Figures. Corresponding control connections 28 in a recess 38 may be seen in FIG. 2 on narrow side 4b.

FIG. 2 schematically shows a cross-section through power semiconductor module 1 of inventive arrangement 100 from the direction of longitudinal side 3a. It again shows U-shaped cooling device 10 which approximately completely forms a second main side 2b and also the two narrow sides 4a/b of power semiconductor module 1. Similarly, cooling device 10 forms a portion of first main side 2a, and portions of the two longitudinal sides 3a/b (cf., FIG. 1). The remaining portions of the first main side 2a and the remaining portions of the one narrow side 4a and both longitudinal sides 3a/b are formed by housing 30.

The interior of U-shaped cooling device 10 in this case contains three switching modules 220 of power electronics circuit 22 on a cooling face 160 of the cooling device 10, said switching modules being in thermal contact with the cooling fluid by means of cooling device 10. The cooling volume 16 of cooling device 10 also has a second cooling face 162, which simultaneously forms a portion of second main side 2b. By way of example, this second cooling face 162 is used for indirectly cooling a capacitor which is thermally linked thereto, cf. FIG. 6.

In the case of power semiconductor module 1, the cooling fluid of the flow 12 enters cooling device 10 through a flow inflow 110 on the second main side 2b and is split into two partial streams in said cooling device by means of a first branch 122. The greater portion of the cooling fluid leaves cooling device 10 of power semiconductor module 1 through a flow outflow 120 on first main side 2a, while a relatively small proportion of the cooling fluid flows through cooling volume 16 with adjacent to cooling face 160.

First main face 2a has a return inflow 130 arranged therein. The cooling fluid of a return 14 enters cooling device 10 through the latter and is combined at a second branch 142 with the cooling fluid which has flowed through cooling volume 16. Return 14 then leaves cooling device 10 through return outflow 140 on second main side 2b.

In addition, power semiconductor module 1 also has an internal control board 240 which, in a manner which is standard in the art, is connected by means of compliant circuitry to switching modules 220 and to power semiconductor components arranged thereon and provides driver functionality for power electronics circuit 22. Control connection 28 is part of internal control board 240 and power electronics switch 20 on one narrow side 4a of power semiconductor module 1, and protrudes through recess 38 in housing 30.

Figure 3:
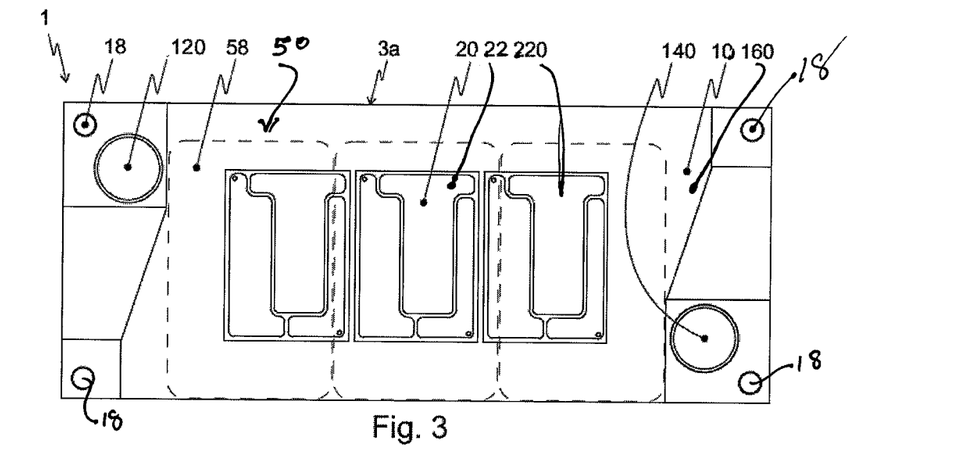
FIG. 3 shows a top plan view of a power semiconductor module which includes the inventive arrangement without a housing and of a corresponding capacitor from the direction of one main side of the module.

FIG. 3 shows a top plan view of a second embodiment of inventive power semiconductor module 1 without a housing, and, indicated in dashes, of a capacitor 50 of analogous design, from the direction of one main side 2a.

In this case, FIG. 3 shows a U-shaped cooling device 10 having a flow outflow 120 and a return outflow 140 in diagonally opposite corners of first main side 2a. In addition, each corner of cooling device 10 may contain recesses 18 which extend through from first main side 2a to second main side 2b, are not connected to the cooling circulation and are used for connection to further power semiconductor modules by virtue of screw joints for connecting the power semiconductor modules to form a modular arrangement according to the invention.

FIG. 3 also shows a cooling face 160 on which three switching modules 220 of power electronics circuit 22 are arranged. The load connections 24 (FIG. 1) extending from these submodules 220 to longitudinal sides 3a/b are omitted for clarity, as are auxiliary connections 28 (FIGS. 1 and 2) extending from these submodules 220 to a narrow side 4a/b.

Capacitor 50 with direct cooling is of identical design to the power semiconductor module in terms of the embodiment of the cooling device. Instead of the switching modules of the power semiconductor module, capacitor 50 is provided with three individual capacitors 58—shown in dashes. Load connections of the capacitor are not shown but may be provided on first longitudinal side 3a.

Figure 4:
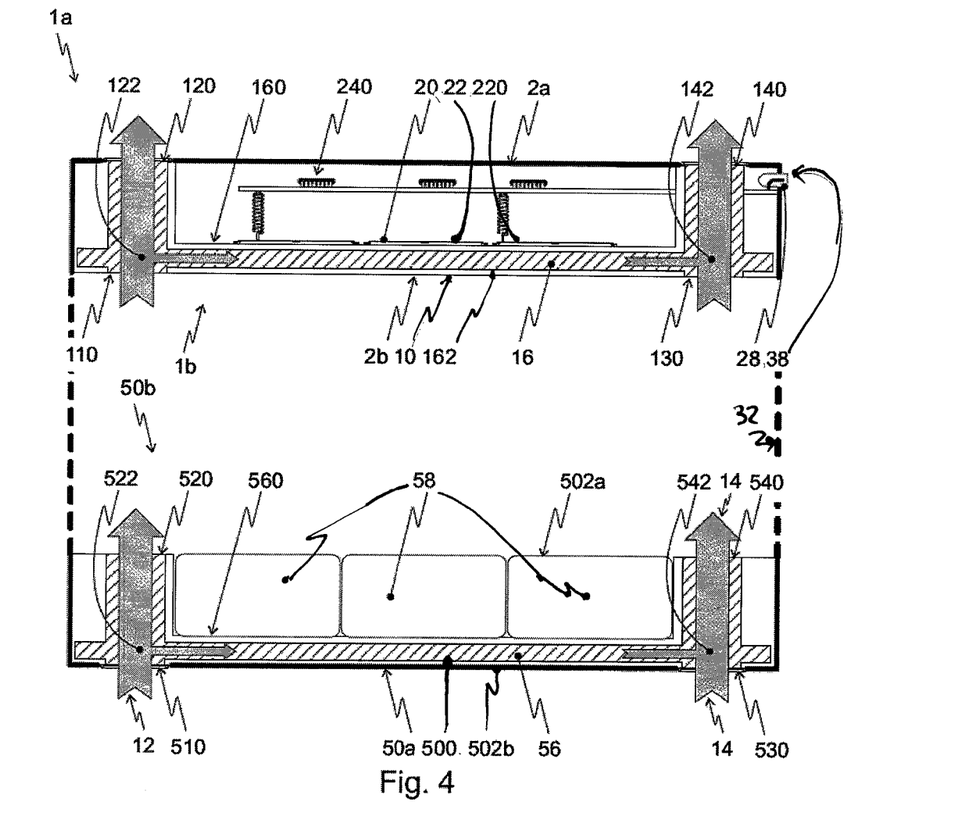
FIG. 4 shows a schematic cross-section through a power semiconductor submodule taken parallel to one longitudinal side, and a corresponding schematic cross-section of a capacitor of the inventive arrangement.

FIG. 4a shows a schematic cross-section through a power semiconductor submodule 1b from the direction of one longitudinal side 3a, and FIG. 4b shows a corresponding schematic cross-section of an integrated capacitor 50b of the inventive arrangement. In one particularly advantageous embodiment, power semiconductor submodule 1b and capacitor 50b are directly connected to one another and therefore form an integrated power semiconductor module 1a, that is to say one having an integrated capacitor 50b. Similarly, it is preferred if this integrated power semiconductor module 1a, that is to say power semiconductor submodule 1b and integrated capacitor 50b, is encapsulated, so that is impervious to dust and moisture. This encapsulation 32 may therefore form a common housing. Since power semiconductor submodule 1b and integrated capacitor 50b are shown at an interval from one another for reasons of clarity, encapsulation 32 is shown in dashes in this interval.

Power semiconductor submodule 1b in turn has a cooling device 10 similar to that of the power semiconductor module shown in FIG. 2. However, in this case, the flow inflow 110, like the return inflow 130, is arranged on second main side 2b. Accordingly, flow outflow 120 and return outflow 140 are arranged on the first main side 2a. In this case, cooling volume 16 likewise forms not only first cooling face 160 for cooling switching modules 220 of power electronics switch 120 but also a second cooling face 162, which is opposite first cooling face 160. Second cooling face 162 is preferably in direct thermal contact with capacitors 58 of integrated capacitor 50b.

Like power semiconductor submodule 1b, this integrated capacitor 50b has a parallelepipedal basic shape. In addition, integrated capacitor 50b has a dedicated cooling device 500 for direct cooling which, like that of the power semiconductor submodule 1b, has a flow inflow 510 and a return inflow 530 on second main side 502b.

In a further preferred embodiment, in integrated power semiconductor submodule 1b with an integrated capacitor 50b, cooling devices 10, 500 of power semiconductor submodule 1b and of integrated capacitor 50b are of more or less integral design. This is intended to be understood to mean that in the embodiment based on this exemplary embodiment, without limiting the general nature, flow outflow 520 of cooling device 500 in integrated capacitor 50b is integrally connected to flow inflow 110 of cooling device 10 in power semiconductor submodule 1b, and the return outflow 540 of integrated capacitor 50b is integrally connected to the return inflow 130 of power semiconductor submodule 1b, without any additional sealing means provided at those points. This does not necessarily mean that the respective cooling devices 10, 500 or the common cooling device formed therefrom must intrinsically likewise be of integral design.

In integrated power semiconductor module 1a, the cooling fluid of flow 12 enters cooling device 10 through a flow inflow 110 on second main side 502b and is split into two partial streams in cooling device 10 by a second branch 522. The substantial portion of the cooling fluid flows on to first branch 122, is again divided at that point and leaves cooling device 10 of the integrated power semiconductor submodule 1b through the flow outflow 120 on first main side 2a, while a respective relatively small proportion of the cooling fluid flows through cooling volumes 16, 56 with the adjoining cooling faces 160, 162, 560.

In this case, three capacitors 58 are arranged on cooling face 560 of cooling device 500 in integrated capacitor 50b and are in thermal contact with second cooling face 162 of power semiconductor submodule 1b and with cooling face 560 of integrated capacitor 50b. This ensures that capacitors 58 are in outstanding thermal contact with the cooling fluid. This is necessary, in particular, because frequently the ability of the capacitors 58 to withstand thermal loads is lower than that of the power semiconductor components of switching modules 220.

Power electronics switch 20 of power semiconductor submodule 1b is fundamentally of the same type of design as that of power semiconductor module 1 shown in FIG. 2 and has switching modules 220, an internal control board 240 and also control connections 28, load input connections 24 and load output connections. These various connections are used for the external connection of power semiconductor submodule 1b. For the embodiment as an integrated power semiconductor module 1a, that is to say as a power semiconductor submodule 1b with an integrated capacitor 50b, it is advantageous if integrated capacitor 50b has no external, that is to say externally connectable, load connections. Instead, it is advantageous if capacitors 58 of integrated capacitor 50b are connected to the associated load connections of power semiconductor submodule 1b internally and can be connected externally by load connections. Depending on the embodiment of power electronics circuit 22, capacitors 58 of integrated capacitor 50b are connected to load input connections 24 or to the load output connections of the power semiconductor submodule 1b internally.

In this advantageous embodiment, the main sides of integrated power semiconductor module 1a are formed from the first main side 2a of power semiconductor submodule 1b and second main side 502b of integrated capacitor 50b. In this case, second main side 2b of power semiconductor submodule 1b effectively forms only the second cooling face 162 of the power semiconductor submodule 1b, while the first main face 502a of the capacitor is formed essentially by the surface of the capacitors 58 that are to be cooled.

Figure 5:
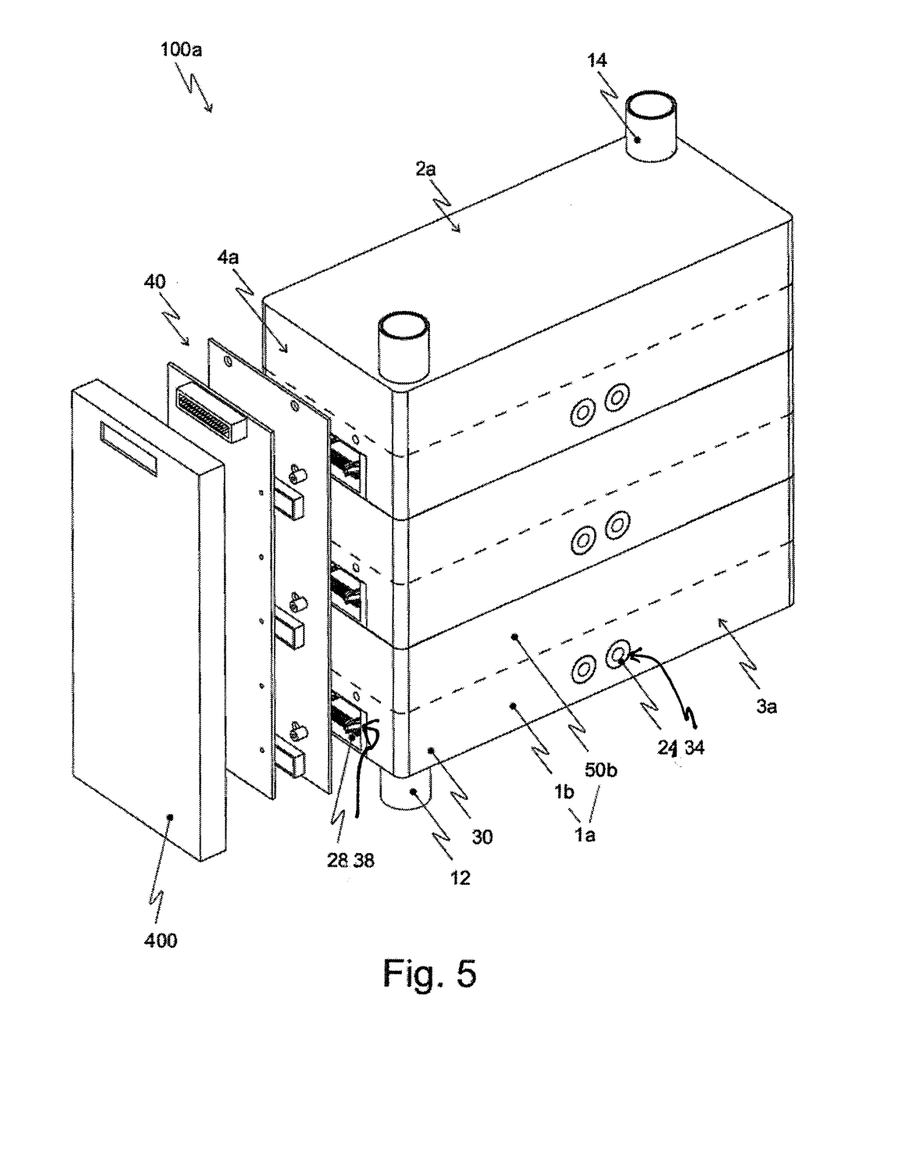
FIG. 5 shows a perspective view of a first embodiment of the inventive arrangement.

FIG. 5 shows a three-dimensional view of a first embodiment of an arrangement 100a according to the invention. This figure shows three integrated power semiconductor modules 1a, for their part each comprising a power semiconductor submodule 1b and a capacitor 50b, which is separated therefrom by a dashed, symbolic dividing line but is not really separate therefrom, cf., FIG. 4.

Integrated power semiconductor modules 1a are connected to one another directly using suitable seals. They are therefore contiguous or are at most only a short distance from one another. To form arrangement 100a, the respective integrated power semiconductor modules 1a are connected to one another by means of a clamping device—not shown. Similarly, respective power semiconductor modules 1a may be connected to one another by means of screw joints, cf., FIG. 2.

Arrangement 100a has a respective common flow 12 and return 14 for the cooling fluid. On the same first longitudinal side 3a which is visible in FIG. 5, each power semiconductor module 1a has load input connections 24—which in this case are in the form of DC voltage connections—which project through recesses 34 in housing 30. The AC voltage connections, the load output connections, of the inverter circuit implemented by means of the power electronics switches of the power semiconductor modules 1a in this case are arranged on the second longitudinal sides, which are not visible.

Auxiliary connections 28 of power semiconductor modules 1a in arrangement 100a are arranged on a narrow side 4a of a respective power semiconductor module 1a. This has the crucial advantage that the longitudinal sides 3a/b are freely available for forming the external load connections. Hence, it is possible to implement a particularly advantageous, for example low-inductance, external connection to this arrangement 100a.

Auxiliary connections 28 project through associated recesses 38 in housing 30 and are in this case connected to a common external control board 40 which may have different functionality. It can be used just for connecting signals but may also have complex control and monitoring functionality. In the embodiment shown here, external control board 40 also has a seal 400 to protect it from environmental influences. This is advantageous particularly in combination with integrated power semiconductor modules 1a that are encapsulated so as to be impervious to dust and moisture.

Figure 6:
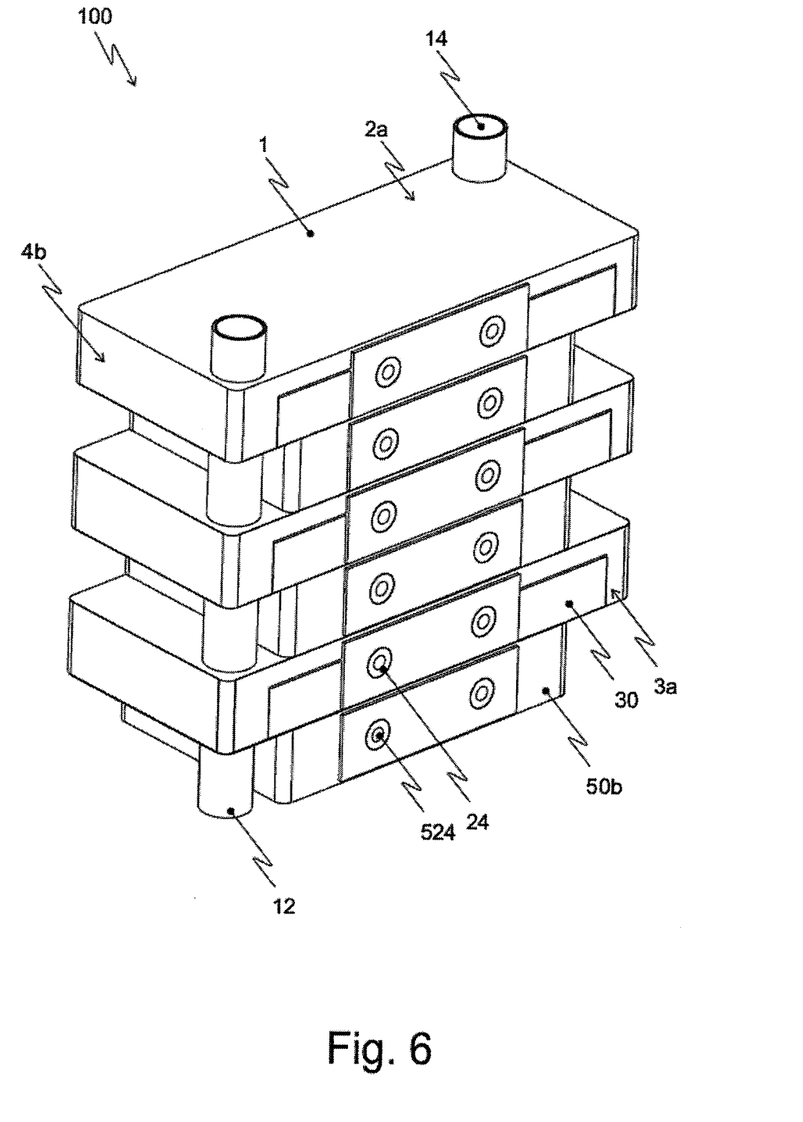
FIG. 6 shows a perspective view of a second embodiment of the inventive arrangement.

FIG. 6 shows a perspective view of a second embodiment of inventive arrangement 100. In this case, a plurality of power semiconductor modules 1 are arranged alternately with capacitors 50 in comparable fashion to those shown in FIG. 2. To produce flow 12 and return 14 of the cooling fluid in arrangement 100, power semiconductor modules 1 are connected to one another (indirectly or directly) by virtue of flow outflow 120 of one power semiconductor module being connected to the flow inflow 110 of the adjacent power semiconductor module and, in substantially the same way, the return outflow 140 of the power semiconductor module is connected to the return inflow 130 of the adjacent power semiconductor module.

This connection may be produced directly or indirectly, i.e., with the interposition of connecting pieces. In each case, it is naturally possible to provide suitable seals in both variants in a manner which is standard in the art.

Capacitors 50 have no dedicated cooling devices and are therefore cooled exclusively indirectly through cooling faces 162 of power semiconductor modules 1.

Similarly, FIG. 6 shows load connections 524 of capacitor 50 in the direction normal to main faces 2a/b in alignment with associated load input connections 24 of power semiconductor modules 1. This allows particularly simple connection of external connections having the same polarity. The load output connections of the power semiconductor modules 1 are arranged on the second longitudinal sides—which are not visible. Auxiliary connections are not shown in this case but may naturally be provided on the narrow sides of the power semiconductor modules.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement having a cooling circulation, the arrangement comprising:
    a plurality of power semiconductor modules having first and second opposed main sides, a first of said power semiconductor modules having a power electronics switch, said power electronics switch having a power electronics circuit, control connection devices, load input connection devices and load output connection devices;
    a cooling device, said cooling device being capable of carrying a flow of a cooling fluid, for cooling said power electronics switch, said cooling device having at least one cooling face;
    a plurality of connection devices for carrying the cooling fluid and for connecting a first main side of said first of said plurality of said power semiconductor modules and a second main side of a second of said plurality of power semiconductor modules, said first and second power semiconductor modules being adjacent to one another; and
    at least one capacitor disposed between said first and second power semiconductor modules, said at least one capacitor including load connection devices which are connected by compliant circuitry to associated ones of at least some of said load input connection devices and said load output connection devices of at least one power semiconductor module;
    wherein at least some of said connection devices are arranged in pairs on said main sides of said first and second power semiconductor modules; and
    wherein said cooling device is in thermal contact with said capacitor and is therefore capable of cooling said capacitor.

2. The arrangement of claim 1, further comprising a housing having recesses to accommodate at least some of said control connection devices, said load input connection devices and said load output connection devices; and
    wherein said housing covers said power electronics circuit towards said cooling device.

3. The arrangement of claim 1, wherein said plurality of connection devices include associated pairs of connection devices.

4. The arrangement of claim 1, wherein a first of said associated pairs of said connection devices includes a flow inflow connection device on said first power semiconductor module and a flow outflow connection device on said second power semiconductor module.

5. The arrangement of claim 4, wherein a second of said associated pairs of said connection devices includes a return inflow connection device and a return outflow connection device.

6. The arrangement of claim 5, wherein
said flow inflow connection device and said return outflow connection device of a single one of said first and second power semiconductor modules are arranged on the same main side of said single one of said first and second power semiconductor modules, and said flow outflow connection device and said return inflow connection device are arranged on the opposing main side of said single one of said first and second power semiconductor modules.

7. The arrangement of claim 6, wherein
said first power semiconductor module includes a flow outflow connection device and return inflow connection device;
said second power semiconductor module includes a flow inflow connection device and a return outflow connection device; and
said flow outflow connection device of said first power semiconductor module is connected to said flow inflow connection device of said second power semiconductor module, and said return inflow connection device of said first power semiconductor module is connected to said return outflow connection device of said second power semiconductor module.

8. The arrangement of claim 5, wherein
said flow inflow connection device and said return inflow connection device of a single one of said first and second power semiconductor modules are arranged on the same main side of said single power semiconductor module, and said flow outflow connection device and said return outflow connection device are arranged on the opposing main side of said single power semiconductor module.

9. The arrangement of claim 8, wherein
said first power semiconductor module includes a flow outflow connection device and return outflow connection device;
said second power semiconductor module includes a flow inflow connection device and a return inflow connection device; and
said flow outflow connection device of said first power semiconductor module is connected to said flow inflow connection device of said second power semiconductor module, and said return outflow connection device of said first power semiconductor module is connected to said return inflow connection device of said second power semiconductor module.

10. The arrangement of claim 5, wherein
said power semiconductor module has a first branch arranged between said flow inflow connection device and said flow outflow connection device and a second branch arranged between said return inflow connection device and said return outflow connection device, said first and second branches being in fluid communication, so that said cooling fluid is able to flow from said flow inflow connection device to said return outflow connection device.

11. The arrangement of claim 1, wherein
said capacitor is in thermally conductive contact with a cooling face of at least one of said first and second power semiconductor modules, and the corresponding connection devices of adjacent power semiconductor modules are directly connected to one another.

12. The arrangement of claim 1, wherein
said capacitor has a plurality of second connection devices which are configured to mate with respective ones of said connection devices of said first power semiconductor module and said second power semiconductor module.

13. The arrangement of claim 1, wherein
said second plurality of connection devices includes a flow inflow connection device, a flow outflow connection device, a return inflow connection device and a return outflow connection device; and
said capacitor further includes a first branch located between said flow inflow connection device and said flow outflow connection device, and a second branch located between said return inflow connection device and said return outflow connection device; and
wherein said first and second branches of said capacitor are in fluid communication.

14. An assembly of at least two integrated power semiconductor modules, each of the integrated power semiconductor modules having opposed main sides, each integrated power semiconductor module comprising:
an integrated capacitor having a power electronics circuit and at least one capacitor;
a housing;
a power semiconductor submodule;
a power electronics switching device, said power electronics switching device having a power electronics circuit, control connection devices, load input connection devices and load output connection devices; and
a cooling device, which is capable of carrying a flow of a cooling fluid for cooling said power electronics circuit and said capacitors in said integrated capacitor, and at least four connection devices for carrying the cooling fluid, said four connection devices being arranged in pairs on the main sides of the integrated power semiconductor module;
wherein the integrated power semiconductor modules can have their main sides connected in modular fashion by connection of their respective connection devices on adjacent ones of the at least two integrated power semiconductor modules; and
wherein said at least one capacitor includes load connection devices which are connected by compliant circuitry to associated ones of at least some of said load input connection devices and said load output connection devices of at least one power semiconductor module.

15. The assembly of claim 14, wherein said capacitors are connected to at least one of associated load input connection devices and load output connection devices exclusively inside the power semiconductor module.

16. Integrated power semiconductor module according to claim 14, wherein said power semiconductor submodule is encapsulated together with said integrated capacitor.

17. An arrangement for cooling a plurality of power semiconductor modules, the arrangement comprising:
means for cooling the power semiconductor module with a cooling fluid;

a plurality of integrated power semiconductor modules, each having a power semiconductor submodule and an integrated capacitor, wherein at least one of said integrated power semiconductor module has
- a power electronics switching device, said power electronics switching device having a power electronics circuit, control connection devices, load input connection devices and load output connection devices;
- a cooling device which is capable of carrying a flow of said cooling fluid, and which has a cooling volume, and at least one cooling face; and
- four connection devices for the cooling fluid arranged in pairs on main sides of said at least one of said integrated power semiconductor modules;

wherein adjacent ones of said plurality of integrated power semiconductor modules have their main sides connected modularly by directly connecting corresponding ones of said connection devices on said adjacent integrated power semiconductor modules; and wherein said integrated capacitor includes load connection devices which are connected by compliant circuitry to associated ones of at least some of said load input connection devices and said load output connection devices of at least one power semiconductor module.

* * * * *